United States Patent
Pruessmann et al.

(10) Patent No.: US 6,326,786 B1
(45) Date of Patent: Dec. 4, 2001

(54) MAGNETIC RESONANCE IMAGING METHOD AND APPARATUS

(75) Inventors: Klaas P. Pruessmann, Zurich; Markus Weiger, Dietikon; Markus B. Scheidegger, Bisikon; Peter Boesiger, Ennetbaden, all of (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/446,237
(22) PCT Filed: Apr. 14, 1999
(86) PCT No.: PCT/IB99/00652
  § 371 Date: Dec. 17, 1999
  § 102(e) Date: Dec. 17, 1999
(87) PCT Pub. No.: WO99/54746
  PCT Pub. Date: Oct. 28, 1999

(30) Foreign Application Priority Data

Apr. 17, 1998 (EP) ................................ 98201229

(51) Int. Cl.$^7$ .................................................. G01V 3/00
(52) U.S. Cl. ................................. 324/312; 324/309
(58) Field of Search ...................... 324/312, 309, 324/307, 318

(56) References Cited

U.S. PATENT DOCUMENTS 5,808,467 * 9/1998 Ochi et al. ........................ 324/309

OTHER PUBLICATIONS

"Simultaneous Acquisition of Spatial Harmonics (SMASH): Fast Imaging with Radiofrequency Coil Arrays" by Daniel K. Sodickson and Warrant J. Manning, in MRM 38: pp. 591–603 (1997).

* cited by examiner

Primary Examiner—Hezron Williams
Assistant Examiner—Dixomara Vargas
(74) Attorney, Agent, or Firm—John Vodopia

(57) ABSTRACT

The invention relates to a method for obtaining images by means of magnetic resonance (MR) of an object placed in a static magnetic field which method includes simultaneous measurement of a number sets of MR signals by application gradients and an array of receiver coils, reconstruction of a number of receiver coil images from the sets MR signals measured and reconstruction of a final image from a distant dependent sensitivity of the receiver coils and the first plurality of receiver coil images. In order to reduce the acquisition time the number of phase encoding steps corresponding to the phase-encoding gradient is reduced with a reduction factor compared to standard Fourier imaging, while a same field of view is maintained as in standard Fourier imaging. In this way fast cardiac imaging may be possible. According to the invention the calculation of complicated matrix inversion can be simplified by determining of an image vector of the final image from a combination of a generalized inverse of a sensitivity matrix and a receiver coil image vector. In this way aliasing artifacts in the final image are reduced. Furthermore, the reconstruction method enables application of non integer reduction factors.

10 Claims, 3 Drawing Sheets

MAGNETIC RESONANCE IMAGING METHOD AND APPARATUS

BACKGROUND OF THE INVENTION

The invention relates to a method for obtaining images by means of magnetic resonance (MR) of an object placed in a static magnetic field comprising the following steps generation of an excitation RF pulse in a part of the body, measurement of a plurality of sets of MR signals using a plurality of receiver coils along a trajectory in k-space comprising a first plurality of lines by application of a read gradient and other gradients, reconstruction of a final image from a combination of the plurality of sets of MR signals measured and distance dependent sensitivities of the plurality of receiver coils. The invention further relates to an MR apparatus arranged for performing such method. In this patent application pixels mean picture elements of a digital image, voxels mean volume-elements of a three-dimensional digital object.

Such a method is known from the article "Simultaneous Acquisition of Spatial Harmonic (SMASH): Fast Imaging with radio frequency Coil Array" by D. K. Sodickson et al, published in Magnetic Resonance in Medicine, vol. 38, page 591–603, 1997. The known method is used, for example, in real time cardiac imaging of human beings. To reduce the acquisition time of MR data in the known method a sub-encoding data acquisition scheme is used wherein the plurality of sets of MR signals are simultaneously measured using the plurality of receiver coils along the trajectory in k-space containing the first plurality of lines using the read gradient and the other gradients. The number of lines corresponds to a reduced number phase-encoding steps in comparison with a number of phase encoding steps in conventional Fourier MR imaging. The receiver coils may be arranged in an array of surface coils. A final MR data set is determined from a specific distance sensitivity function of the set of receiver coils and the sets of MR signals measured. The final MR data set then contains the information of the number of lines of the conventional Fourier MR imaging. The final image is then reconstructed by transforming the final MR data set. The number of sets of MR signals may be equal to the number of receiver coils in the array. Furthermore, the specific distance sensitivity function of the set of receiver coils must have a sinusoidal shape. By the simultaneous measurement of MR data is the acquisition time is reduced. The reduction factor is determined by the number of lines in k-space corresponding to the final image and the number of lines which the sub-encoding data acquisition employs. The reduction in the acquisition time may, for example, enable application in real time cardiac imaging or functional imaging. A disadvantage of the known method is that it may be limited to only a few positions of a field of view and a limited number of orientations of the slice of the object to be image because of the specific sensitivity function of the set of coils. The field of view is defined by a distance in a phase encoding direction covered by the trajectory in the k-space.

OBJECTS AND SUMMARY OF THE INVENTION

It is an object of the present invention to provide an MR imaging method with an improved degree of freedom in the choice of field of view and orientation of the slice to be imaged. To this end, the method in accordance with the invention is characterised in that for the reconstruction of the final image the method comprises a further step of reconstruction of receiver coil images from each set of MR signals measured respectively, and in that the final image is reconstructed from a combination of the receiver coil images and the distance dependent sensitivities of the receiver coils. In this way the reconstruction of the final image does not depend on a specific sensitivity function of the sets of receiver coils and can be applied for an arbitrary set of receiver coils and the restrictions on the size of the field of view and the orientation of the slice to be image are less severe. Furthermore, non-integer reduction factors can be chosen. This option gives a possibility to shift aliasing artefacts to less important parts of the image. Simultaneous or partly simultaneous measurement of the MR data sets yields a reduction in the acquisition time and a possibility of fast MR imaging compared to conventional MR-imaging.

A particular version of the method according to the invention comprises a step of determining an image vector of the final image from a combination of a generalised inverse of a sensitivity matrix and a receiver coil image vector, wherein an image vector component represents a value of a tissue contrast function at a position of a volume-element selected from a first plurality of equidistant volume-elements in a first plurality of adjacent fields of views, an element $S(i,j)$ of the sensitivity matrix represents a sensitivity at the position of the selected volume-element with respect to a receiver coil selected from the first plurality of receiver coils and a receiver coil image vector component represents a pixel value of a receiver coil image corresponding to the selected receiver coil, a position of the pixel in the receiver coil image corresponding with the position of the selected volume-element in the selected field of view. The generalised inverse of a matrix $S$ is defined as a matrix product $(S^H S)^{-1} S^H$, wherein $S^H$ represents a complex conjugate transpose of the matrix $S$. The generalised inverse or pseudo inverse is known in applied mathematics for the following property $$\|S(S^+ a) - a\| = \min_x \|Sx - a\|.$$

That is, given a vector equation $Sx=a$, which does not have an exact solution for x due to over determination, the pseudo inverse yields a vector that best fits that equation in the above sense. In the reconstruction method according to the invention use is made of this minimisation property. The pixel wise reconstruction method provides a possibility to include an actual degree of aliasing in the reconstruction method in order to reduce the different types of aliasing. As a result the method according to the invention provides substantially aliasing free final images in case of both non-integer and integer reduction factors.

A further version of the method according to the invention is characterised in that a reduction factor of acquisition of the sets of MR signals amounts to a real value smaller than or equal to the number of receiver coils. The reduction factor is defined as the factor with which the distance between the lines of the trajectory in k-space is increased as compared with the distance between adjacent lines in k-space in conventional Fourier MR imaging. As a result the acquisition time of the sets of MR signals is reduced proportionally. In cardiac imaging, for example, regions of lung tissue of the human being can be often excluded from the image reconstruction due to a negligible signal contribution resulting from the choice of an optimal reduction factor. An optimal choice of the reduction factor can be chosen such that for example a high intensity fold-over of a back chest wall of the human being is directed off the heart in to the lung regions.

The optimal choice of the reduction factor may result in different type of aliasing in the final image.

A further version of the method according to the invention is characterised in that the method comprises a step of determining a dimension of the image vector from a number of the first plurality of equidistant voxels in a final field of view of the final image, a distance between subsequent voxels being equal to the field of view. An actual degree of aliasing can thus be determined and taken into account in the reconstruction process of the final image. As a result fold-over artefacts in the final image, are reduced. In case of a non-integer reduction factor the degree of aliasing varies in different pixels of the final image because the actual number of the volume-elements or voxels varies that contributed to a picture element of the single receiver coil images. In general, a pixel value of a single receiver coil image contains contributions from an infinite series of equidistant voxels in adjacent field of views. Limiting this series reduces the aliasing in the final image. For example, when the reduction factor is 2.5 a first group of pixels of the single receiver coil image will show two-fold overlap and a second group of pixels in the single receiver coil image will show tree-fold overlap. Contributions of the first group of pixels are determined by two voxels in the final field of view, separated by a first distance, and contributions of the second group are determined by three equidistant voxels in the final field of view, separated by a second distance, wherein the second distance between the voxels is equal to a length of the field of view of a single coil image. In the known method either the contributions of two pixels or the contribution of three pixels can only be taken into account and, as a consequence, three fold-over artefacts or twofold fold-over artefact, respectively, are present in the final image. A further advantage is that the reconstruction time of the final image is further reduced.

A further version of the method according to the invention is characterised in that the method comprises a step of excluding volume-elements in the final field of view outside a predetermined region not comprising the object from the reconstruction of the final image. In this way a local signal to noise ratio of the final image can be improved. Exclusion of a volume-element of a measurement space from the reconstruction process is possible if said volume-element is a priori known to lie outside of the object. In that case no signal contribution from this volume-element need to be separated from those contributions of the volume-elements of the object in the fold over of the picture elements in the single receiver coil images. Knowledge whether a volume-element in the measurement space comprises structure of the object can be derived from a first reference image obtained from the object in an earlier stage by a conventional MR imaging process, for example an echo-planar imaging method.

A further version of the method according to the invention is characterised in that the method comprises a step of determining the sensitivity matrix from a sensitivity map comprising a combination of predetermined reference receiver coil images and a predetermined reference image. Sensitivity matrices which are independent of tissue contrast can thus be obtained for use in the reconstruction method. The obtained sensitivity matrices reflect only coil sensitivity and allow for smoothing. Said first obtained reference image can be used as a predetermined reference image.

A further version of the method according to the invention is characterised in that the method comprises a step of filtering the sensitivity map so as to obtain sensitivity maps covering a region in the final field of view larger than the region of interest. A low pass filtered sensitivity map is an example of such a sensitivity map. The imaging method can then be applied when the tissue configuration changes, because the sensitivity of the receiver coils is in first order independent of the configuration changes with respect to the field of view. This enables successive MR imaging of a slightly moving object with a single initial reference image measurement, this is advantageous for example, for real time cardiac MR imaging. Furthermore, the sensitivity matrices obtained don't introduce noise in the reconstructed final image, so that the signal to noise ratio of the final image is further reduced. A low pass filtering step is an example of such a filtering step. Another kind of filtering comprises a step of polynomial fitting.

A further version of the method according to the invention is characterised in that the method comprises a step of obtaining the predetermined reference receiver coil image by an MR method including the following steps generation of an excitation RF pulse in the object, simultaneously measurement of receiver coil reference sets of MR signals by using the first plurality of receiver coils along a predetermined trajectory comprising a second plurality of lines in k-space by application of a read gradient and other gradients and reconstruction of the reference receiver coil images from the receiver coil reference sets of MR signals measured, the second plurality of lines being less than the first plurality of lines. A suitable knowledge of the coil sensitivities can thus be obtained. For example, a reference measurement of the object is made with the final arrangement of the receiver coils and the object. A reference image can also be obtained from a combination of the reference receiver coil images.

A further version of the method according to the invention is characterised in that the method comprises a step of obtaining the predetermined reference image by an MR method comprising the following sub-steps generation of an excitation RF pulse in the object, measurement of a reference set of MR signals along a predetermined trajectory comprising a third plurality of lines in k-space by application of a read gradient and other gradients and reconstruction of the reference image from the measured MR signals measured. This yields the predetermined reference image of the object that can be used as the reference image in the determining of sensitivity matrices. The number of lines of the third plurality may be equal to the number of lines in k-space corresponding to the final image. The advantage of the application of the predetermined reference image thus obtained is that the reconstructed image is intensity corrected and contains correct phase information.

The invention further relates to an MR apparatus for obtaining MR comprising input terminals for an arrangement of receiver coils, a body coil, means for measurement a plurality,of sets of MR signals via the arrangement of receiver coils, means for reconstruction of a final image from a distance dependent sensitivity of the receiver coils and the plurality of sets of MR signals measured. A further object of the invention is to provide an MR apparatus having an improved degree of freedom in the choice of field of view and orientation of the slice to be imaged. To this end, the MR-apparatus in accordance with the invention is characterised in that the MR apparatus comprises means for reconstruction of a plurality of receiver coil images from the plurality of sets of MR signals measured respectively, and means for reconstruction of the final image from a combination of the plurality of receiver coil images and the distance dependent sensitivities of the receiver coils.

BRIEF DESCRIPTION OF THE DRAWINGS

These and other aspects of the invention are further explained with reference to the accompanying drawing of which

An image or distribution may be in two dimensial (x,y) or in three dimensional (x,y,z) representation. A digital image consists of picture elements which are usually called pixels or, in the three-dimensional case, voxels.

As is also customary in the art of magnetic resonance imaging, the signals are sampled and digitised and the further image processing is digital. All that is implicit in this description.

Where in the description reference is made to nuclear magnetic resonance, this implies nuclear spin resonance which in a specific situation is proton spin resonance and it also implies electron spin resonance.

DESCRIPTION OF THE PREFERRED EMBODIMENTS

The object to be imaged is then a patient or generally a human being to be examined.

Figure 1:
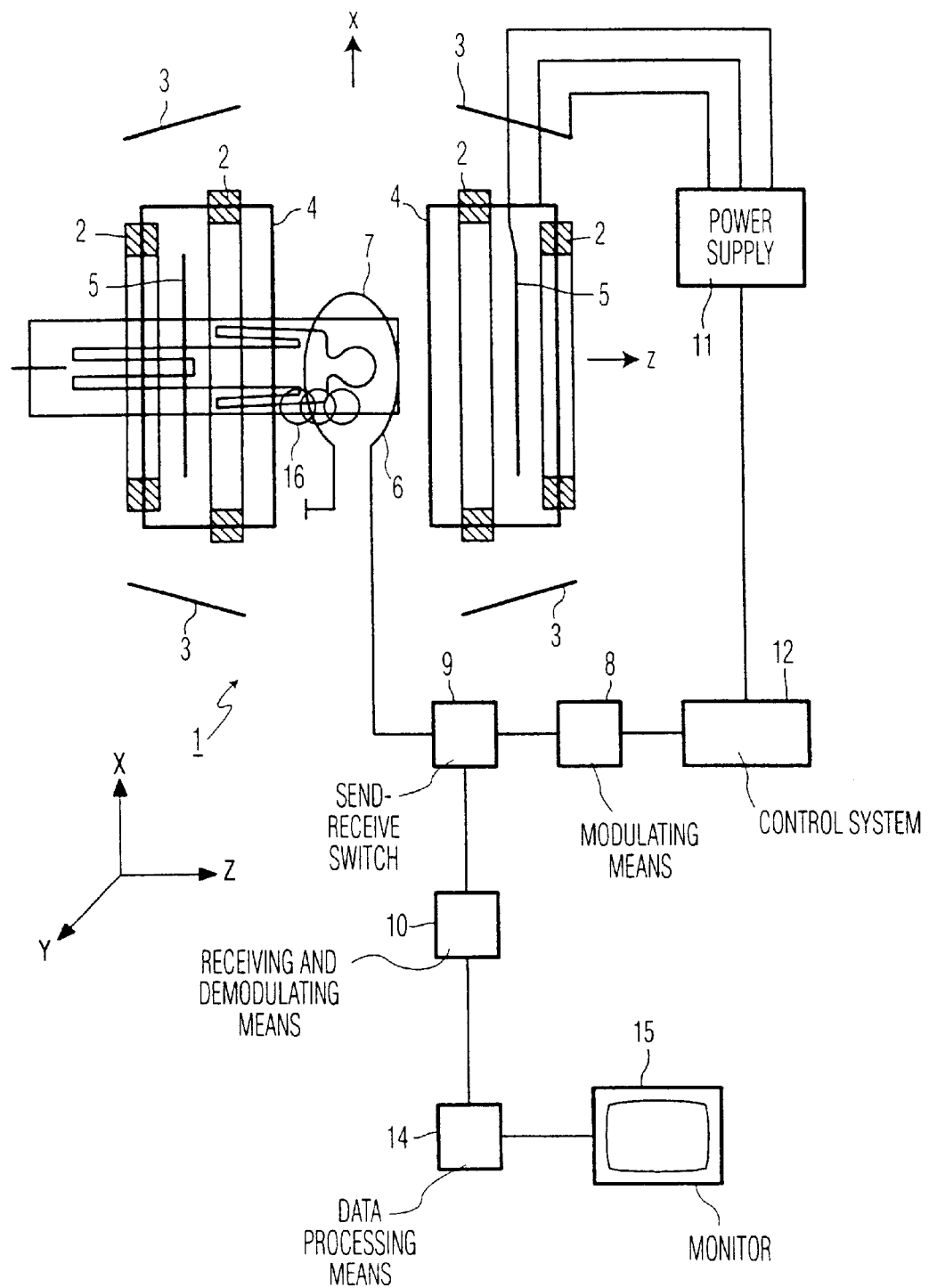
FIG. 1 shows a block diagram of an apparatus for performing a method according to the invention.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing on to the main magnetic field additional magnetic fields with controllable strength and having a gradient in a selected direction. Conventionally, the direction of the main magnetic field is labelled the z direction, the two directions perpendicular thereto are the x and y directions. The gradient coils are energised via a power supply 11. The apparatus further comprises excitation means 6 in the form of a so-called body coil for emitting radio-frequency pulses (RF-pulses) to an object or body 7, the excitation means 6 being coupled to modulating means 8 for generating and modulating of the RF-pulses.

Also provided are means for receiving the MR-signals, these means can be identical to the excitation means 6 or be separate, as with the present invention, in the form of an array of receiver coils 16. A body coil is a coil surrounding a (part of a) body and has generally a very homogeneous sensitivity distribution, whereas a receiver coil is a coil used close to one side of a (part of a) body. A receiver coil has generally a limited field of view, a high sensitivity but an inhomogeneous spatial sensitivity distribution.

A send-receive switch 9 is arranged to separate the received signals from the excitation pulses. The received magnetic resonance signals are input to receiving and demodulating means 10. The excitation means 6 and modulating means 8 and the power supply 11 for the gradient coils 3, 4 and 5 are steered by a control system 12 to generate a predetermined sequence of RF-pulses and gradient field pulses. The demodulation means is coupled to data processing means 14, for example a computer, for transformation of the received signals into an image that can be made visible, for example on a visual display unit 15.

If the magnetic resonance apparatus 1 is put into operation with an object or body 7 placed in the magnetic field, a small excess of magnetic dipole moments (nuclear or electron spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the dipole moments, thereby bringing the dipole moments in an exited state and re-orienting the magnetisation $M_0$. By applying the proper RF-pulses, a rotation of the macroscopic magnetisation is obtained, the angle of rotation is called the flip-angle. The introduction of variations in the magnetic field by applying gradient magnetic fields influences the behaviour of the magnetisation locally. After the application of RF-pulses, the changed magnetisation will tend to return to a state of thermal equilibrium in the magnetic field, emitting radiation in the process. A well chosen sequence of RF-pulses and gradient field pulses causes this radiation to be emitted as (decaying) magnetic resonance signals which provide spatial information about the density and/or relaxation times of a certain type of nuclei, for example hydrogen nuclei, and the substance in which they occur. By analysis of the emitted signals, picked up by the coil 6 or with the receiver coil array 16—and by presentation of it in the form of images, information about the internal structure of the object or body 7 is accessible. The decaying magnetic resonance signal directly after the excitation is called FID (Free Induction Decay). By proper application of the gradients and/or application of additional excitation (RF) pulses also an echo of the FID may be produced and used to derive image information.

For a more detailed description of magnetic resonance imaging MRI) and MRI-devices reference is made to the extensive literature on this subject, for example to the book "Magnetic Resonance Imaging", by M. T. Vlaardingerbroek, Spinger Verlag, 1996.

Figure 2:
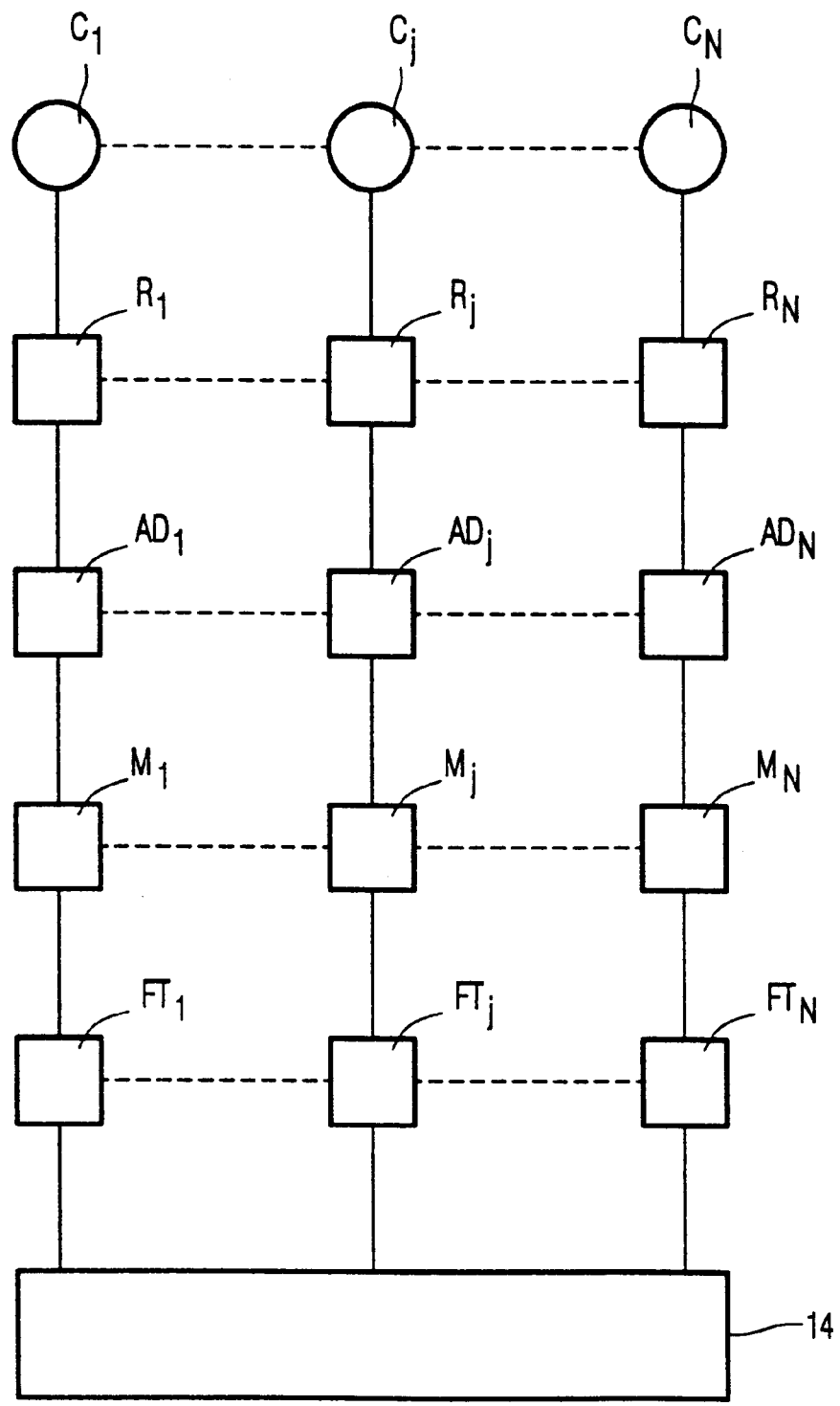
FIG. 2 shows a block diagram of a detail of such apparatus.

FIG. 2 shows the receiving and demodulating means for the array of receiver coils are shown. Receiver coils $C_1, \ldots, C_j \ldots, C_n$ arranged in an array of receiver coils 16 are connected to receivers circuits $R_1, \ldots, R_j \ldots, R_n$ analog to digital converters $AD_1, \ldots, AD_j \ldots, AD_n$, memories $M_1, \ldots, M_j \ldots, M_n$, and Fourier transform means $FT_1, \ldots, FT_j, \ldots, FT_n$. By means of the Fourier transform means N receiver coil images from MR signals, preferably simultaneously, detected by the N receiver coils are determined in a well known way. The N receiver coil images are processed in processing means 14 to obtain the final image. In conventional Fourier MR imaging MR signals are measured along a trajectory in k-space containing a first number NF of parallel lines in k-space by application of appropriate read gradients and other gradients. In practice this number NF amounts to for example 256. In order to reduce the acquisition time of the final image a distance between the adjacent lines along which lines the k-space have been scanned is enlarged and the number phase encoding steps is reduced proportionally. The reduction factor RN can be chosen as a real number or integer number smaller than or equal to the number of receiver coils N. In this example the number of phase encoding steps NF of the final image amounts to, for example, 128 and the number of receiver coils N amounts to, for example, five. The Fourier transform means reconstructs the single receiver coil images from the sets of MR signals, respectively. Each set of MR signal received by one of the receiver coils. Each single receiver coil image is related to a field of view of the object which is reduced compared to the final field of view of the object related to the final image proportionally by the reduction factor. Furthermore, in this example the field of view and the final field of view are related to the direction of the applied phase encoding gradients.

The aliasing artefacts in pixels of a single receiver coil image are caused by a superposition of contributions of N equidistant voxels in the final field of view, a distance between the subsequent equidistant voxels being determined by the field of view. A fold-over in different pixels a(i) of the receiver coil image vector a having identical positions in the N subsequent receiver coil images is described by $$a = Sb \tag{1}$$

wherein the vector component a(i) represents a pixel value of a receiver coil image SCI(i) selected from the N receiver coil images, an element of the sensitivity matrix S(i,j) represents a complex sensitivity at a position of the pixel OP(j) selected from the N pixels of the receiver coil SC(i) selected from the N receiver coils and the vector b(j) represents a value of a tissue contrast function at a position of a volume-element in a field of view FOV(j) selected from N equidistant volume-elements in N adjacent fields of views. The field of view is defined by the trajectory in the k-space for which the N sets of MR signals of the related receiver coil image are measured. The vector b is then determined according to $$|Sb-a| = \min \rightarrow b = S^+ a \tag{2}$$

wherein $S^+$ represents the generalised inverse of the matrix S. The generalised inverse of a matrix S is defined as a matrix product $(S^H S)^{-1} S^H$, wherein $S^H$ represents a complex conjugate transpose of the matrix S. The generalised inverse or pseudo inverse is known in applied mathematics for the following property $$\|S(S^+ a) - a\| = \min_x \|Sx - a\|$$

That is given a vector equation Sx=a, which does not have an exact solution for x due to over determination, the pseudo inverse yields a vector that best fits that equation in the above sense. In this reconstruction method use is made of this minimisation property. In equation (2) the vector b is thus calculated by matrix calculus. These vector b is calculated for all the positions in the field of view. As a result of these steps the final image at the standard resolution can be obtained with reduced aliasing artefacts.

In several cases the aliasing artefacts can be reduced further in the reconstructed final image by selecting the reduction factor such that the aliasing artefacts are laying outside the area of interest. For example, in cardiac imaging region of lung tissue can often be excluded from the image reconstruction due a negligible signal contribution. Preferably, an optimal choice for the reduction factor will in that case be selected such that a high intensity fold-over of the back chest wall is directed of the heart into lung regions. In that case the optimal choice for the reduction factor may be a non-integer number, smaller than the number of the receiver coils N in the receiver coil array 16. However, when the reduction factor amounts to a non-integer number different type of aliasing artefacts will occur in the final image, for example, when the reduction factor RN has a value 2.5, a two-fold overlap as well as three-fold overlap will occur in the final image.

In order to reduce the different type of aliasing artefacts in the final image an aliasing degree can be determined and taken into account by determining a dimension of the image vector b. The determining of the actual degree of aliasing and the dimension of the image vector b for the receiver coil array 16 comprising, for example three receiver coils, is explained with relation to FIG. 3 and FIG. 4.

Figure 3:
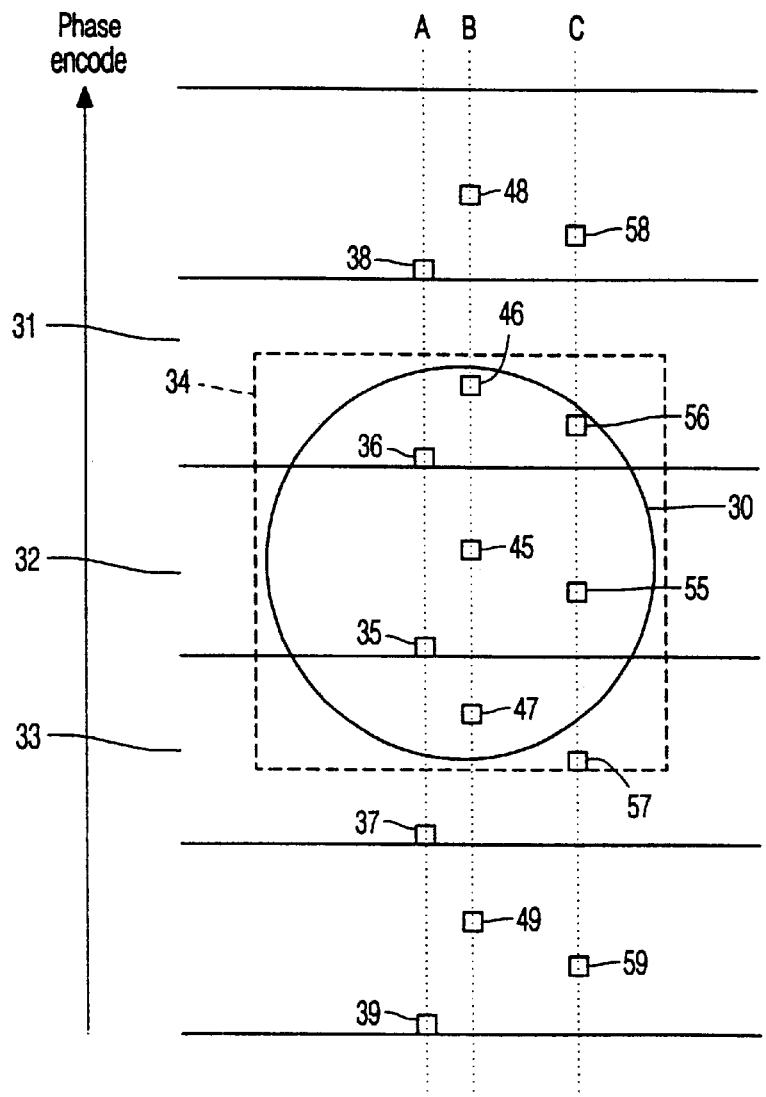
FIG. 3 shows an example of a final field of view of an object.

FIG. 3 shows a final field of view of an object. FIG. 3 comprises a circle 30 representing an object to be imaged, for example the heart of a patient or a human being. Furthermore, FIG. 3 shows three adjacent field of views, a central field of view 32, a top field of view 31 and bottom field of view 33. These adjacent fields of view fit in a final field of view 34. If the number of phase-encoding steps of the final image is given by NF and the number of phase-encoding steps of the single receiver coil images is given by NR then the reduction factor RN is given by RN=NF/NR. Preferably, the reduction factor RN is chosen such that an integer number of voxels fits in the field of view 31,32,33 of the single receiver coil images. In this example, the number RN equals 2.5. Contributions from voxels of adjacent fields of view 31,33 and a voxel of a central field of view 32 are then added to yield a pixel value of the single receiver coil image. In FIG. 3 only the three adjacent field of view comprise material of the object 30.

Figure 4:
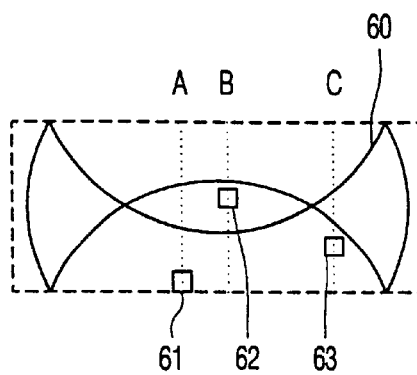
FIG. 4 shows an example of aliasing in a single receiver coil image.

FIG. 4 shows the single receiver coil image 60, comprising a superposition of the adjacent field of views 31,32,33. For the reduction of aliasing artefacts in a pixel in a receiver coil image of FIG. 4 the contributing voxels of the final field 34 of view of FIG. 3 have to be separated. This superposition of adjacent fields of view is explained by way of example. FIG. 3 shows three central voxels 35,45,55 in the central field of view 32 in FIG. 3 and contributing voxels 36–39, 46–49,56–59 in the adjacent field of views 31,33. FIG. 4 shows the first, second and third pixels 61,62,63 in a single receiver coil image 60, which pixel values contains an infinite series of potentially contributing voxels. In FIG. 3, for sake of simplicity, only voxels 36–39, 46–49,56–59 are shown. Separation in a single pixel value of the final image of the superposition of the pixel values of the receiver coil images is done by use of equation (2). In order the reduce the processing time of the final image preferably the dimension of the image vector b is determined by the number of the adjacent voxels in the subsequent fields of view 31,32,33, which are located in the final field of view 34, and a distance between subsequent equidistant voxels being equal to the field of view. Consequently, for a first central voxel 35 close to the edge of the central field of view only two voxels 35,36 are present in the final field of view 34 in FIG. 3, whereas for the second central voxel 45 in the centre of the central field of view 32 three voxels 45,46,47 are present in the final field of view 34 and for the third central voxel 55 three voxels 55,56,57 are present in the final field of view 34.

In order to improve the local signal to noise ratio of the final image, the method comprises a further step of excluding volume-elements in the final field of view outside a predetermined region not comprising the object, from the reconstruction of the final image. The signal-to-noise ratio of the reconstructed final image can be approximated by $$\frac{SNR_{full}}{SNR_L} = LG \sqrt{RN} \tag{3}$$

wherein LG≧1 represents a local geometry factor reflecting a degree of linear dependence of the receiver coil sensitivities at superimposed positions. The factor LG is calculated from the matrix S only, thus enabling a priori estimates of SRN and optimal choice of RN. In order to reduce the geometry factor LG those voxels which lie outside of the object as determined by a reference image, are excluded from reconstruction and are set to zero in the final image. For example, in FIG. 4 it can be seen that the three voxels 55,56,57 in the final field of view 34 contribute to the pixel 63 in the single receiver coil image 60. However, from the reference image it can be derived that voxel 57 does not represent any structure of the object to contribute to the MR signal. So, in this example the dimension of the image vector b containing the pixels of the final image is determined by only two contributing voxels 55,56. The value of the excluded voxel 57 is set to zero in the final image.

Different sensitivity matrices S can be determined respectively from sensitivity maps of the N receiver coils. In order to obtain the sensitivity maps of the receiver coils a set of low resolution reference receiver coil images of arbitrary contrast are divided pixel wise by a reference image. A set of low resolution reference receiver coil images are reconstructed, from a set of, preferably, simultaneously acquired MR signals by separate MR imaging sequences. The set of simultaneously acquired MR signal can be measured, for example, by a known echo planar imaging (EPI) sequence. For example an echo planar imaging sequence as described in the cited handbook "Magnetic Resonance Imaging", by M. T. Vlaardingerbroek, Spinger Verlag, 1996 The EPI imaging sequence comprises an excitation of a RF pulse and, preferably, simultaneously measurement of five receiver coil reference sets of MR signals along a first number of parallel lines in k-space by application of a read gradient and other gradients on the static magnetic field. The first number of parallel lines corresponding with a reduced number of phase encoding steps compared to the number NF, for example 64 phase encoding steps. Preferably, the first numbers of parallel lines are located around a central part of k-space such that a low resolution reference receiver coil images are obtained The reference image can be obtained, for example, by determining a square root of sum of squares of the reconstructed reference receiver coil images. Another possibility to obtain the reference is image is to reconstruct a body coil image from reference MR signals measured for example by a separate imaging sequence using the bodycoil 6. Preferably, the pulse sequences used to measure the reference MR signals are of the same type as the pulse sequences used to measure the receiver coil images. The separate acquisition of MR signal for reconstruction of the reference image comprises generation of an RF excitation pulse and measurement of the reference MR signals along a second number of parallel lines in k-space by application of read gradient and other gradients, such as a phase encoding gradient. The second number is smaller than the number of phase encoding steps NF corresponding to the final image, for example, the second number equals 64. Preferably, the second numbers of parallel lines are located around a central part of k-space such that a low resolution body coil image is obtained. Furthermore, the image volume of the reference image may be larger that the region of interest of the final field of view.

In order to enable fast imaging of a slightly moving part of the patient's anatomy, such as the patient's heart, with a single initial reference image the method comprises a step of filtering the raw sensitivity maps in order to obtain sensitivity maps covering a region larger than the heart to be imaged. This is advantageous for real time cardiac imaging. For example, said step of filtering comprises a low pass filter. In general, sensitivity maps may be impaired with noise, in particular in regions with low or zero contribution to the MR signals said filter reduces also the noise.

However, in order to prevent errors at object edges in the sensitivity maps preferably a two-dimensional polynomial fit technique is applied instead of said low pass filtering. According to the two-dimensional fit technique for each pixel of a refined sensitivity map a 2D polynomial is locally fit to the sensitivity map. A refined sensitivity value of the pixel is obtained by evaluation of the fitting polynomial at the position of the respective pixel in the sensitivity map. Fitting is based on valuable data of the sensitivity maps. Valuable data can be obtained by thresholding the sensitivity map according to signal strength in the body coil image and subsequent exclusion of isolated pixels, for example, by minimum neighbourhood filtering. The remaining pixels, plus a predetermined neighbourhood determined by region growing of a region containing the remaining pixels, form the set for which refined sensitivity values are calculated by fitting. The fitting comprises calculation of an L-th order fitting polynomial for the position $x_0, y_0$ of a sensitivity map of a receiver coil given by $$s(x, y) = \sum_{i,j=0}^{L} c_{ij}(x - x_0)^i (y - y_0)^j \tag{4}$$

The complex coefficients $c_{ij}$ are determined such that the quantity $$\Delta = \sum_k w_k |s_k - s(x_k, y_k)|^2 \tag{5}$$

has its minimum value, wherein k represents a number of pixels taken into account, $s_k$ denotes the sensitivity value of the pixel $x_k, y_k$, taken into account and $w_k$ a weighting factor given by the product of a Gaussian kernel centred at $x_0, y_0$, and the 'reliability' of $S_k$, derived from the signal strength in the body coil image applied for the thresholding. A width of the Gaussian kernel corresponds to a desired degree of smoothing. The minimum condition (5) yields $(L+1)^2$ linear equations:

$$\frac{\partial \Delta}{\partial c_{ij}} = 0 \Rightarrow \sum_{i',j'=0}^{L} c_{i'j'} A_{ii'jj'} = b_{ij} \tag{6}$$

wherein $$A_{ii'jj'} = \sum_k w_k (x_k - x_0)^{i+i'} (y_k - y_0)^{j+j'} \tag{7}$$

$$b_{ij} = \sum_k w_k s_k (x_k - x_0)^i (y_k - y_0)^j \tag{8}$$

Solving the equations (6) for $c_{00}$ yields the desired refined sensitivity value at the position $x_0, y_0$. In order to reduce the required calculation time of the polynomial fitting only significant terms of the sums in (7),(8) are taken into account and high order fitting is restricted to border regions of the objects.

Furthermore, in order to reduce a scan time the field of view of the final image can be chosen so as to be rectangular. For example, in 2D functional brain imaging at equal resolution in both directions a 200×256 image may be sufficient to measure MR signals with EPI imaging sequence comprising 100 phase encoding steps when two receiver coils are employed. For a square image of 256×256 more phase encoding steps are necessary with the same number of receiver coils. Beside possible applications of the method according to the invention in cardiac imaging the described method may also be applied in for example, functional imaging of the brain of a human or animal body.

What is claimed is:

1. A method for obtaining images by means of magnetic resonance (MR) of an object placed in a static magnetic field comprising the following steps:

generating an excitation RF pulse in a part of the body, measuring a plurality of sets of MR signals using a plurality of receiver coils along a trajectory in k-space comprising a first plurality of lines by application of a read gradient and other gradients, reconstructing a final image from a combination of the plurality of sets of MR signals measured and distance dependent sensitivities of the plurality of receiver coils, reconstructing-receiver coil images from each set of MR signals measured respectively, and reconstructing the final image from a combination of the receiver coil images and the distance dependent sensitivities of the received coils, said combination including images from at least one set of MR signals.

2. A method according to claim 1 characterised in that for reconstruction of the final image the method comprises a step of determining an image vector of the final image from a combination of a generalised inverse of a sensitivity matrix and a receiver coil image vector, wherein an image vector component represents a value of a tissue contrast function at a position of a volume-element in a field of view selected from a first plurality of equidistant volume-elements in a first plurality of adjacent fields of views, an element $S(i,j)$ of the sensitivity matrix represents a sensitivity at the position of the selected volume-element with respect to a receiver coil selected from the plurality of receiver coils and a receiver coil image vector component representing a pixel value of a receiver coil image corresponding to the selected receiver coil, a position of the pixel in the receiver coil image corresponding with the position of the selected volume-element in the selected field of view.

3. A method as claimed in claim 1, wherein a reduction factor of acquisition of the sets of MR signals amounts to a real value smaller than the number of receiver coils.

4. A method as claimed in claim 1, wherein the method comprises a step of determining a dimension of the image vector from a number of equidistant voxels in a final field of view of the final image, the number being smaller than or equal to the number of receiver coils, a distance between subsequent voxels being equal to the field of view.

5. A method as claimed in claim 1, wherein the method comprises a step of excluding volume-elements in the final field of view outside a predetermined region not comprising the object from the reconstruction of the final image.

6. A method as claimed in claim 1, wherein the method comprises a step of determining the sensitivity matrix from a sensitivity map comprising a combination of a predetermined reference receiver coil images and a predetermined reference image.

7. A method as claimed in claim 6, wherein the method comprises a step of filtering of the sensitivity map so as to obtain sensitivity maps covering a region in the final field of view larger than the region of interest.

8. A method as claimed in claim 6 further comprising a step of obtaining the predetermined reference receiver coil image by an MR method including:

generating an excitation RF pulse in a part of the body, measuring a plurality of receiver coil reference sets of MR signals using the plurality of receiver coils along a predetermined trajectory comprising a second plurality of lines in k-space by application of a read gradient and other gradients, and reconstructing reference receiver coil images from the plurality of sets of MR signals measured respectively, the second plurality of lines being less than the first plurality of lines.

9. A method as claimed in claim 6 wherein the method comprises the step of obtaining the predetermined reference image by an MR method comprising sub-steps of generating an excitation RF pulse in the object, measuring a reference set of MR signals along a predetermined trajectory comprising a third plurality of lines in k-space by application of a read gradient and other gradients, and reconstructing the reference image from the measured MR signals.

10. An MR apparatus for obtaining MR images of a part of a body using a method as claimed in claim 1, comprising input terminals for an arrangement of receiver coils, a body coil, means for measurement of a plurality of sets of MR signals via the arrangement of receiver coils, means for reconstruction of a final image from a distance dependent sensitivity of the receiver coils and the plurality of sets of MR signals measured, means for reconstruction of a plurality of sets of MR signals measured respectively and means for reconstruction of the final image and the distance dependent sensitivities of the receiver coils.

* * * * *